(12) United States Patent
Lee et al.

(10) Patent No.: US 12,733,389 B2
(45) Date of Patent: Sep. 8, 2026

(54) DISPLAY APPARATUS

(71) Applicant: LG Display Co., Ltd., Seoul (KR)

(72) Inventors: Gyeore Lee, Gumi-si (KR); Daljae Lee, Chilgok-gun (KR)

(73) Assignee: LG DISPLAY CO., LTD., Seoul (KR)

( * ) Notice: Subject to any disclaimer, the term of this patent is extended or adjusted under 35 U.S.C. 154(b) by 738 days.

(21) Appl. No.: 17/970,429

(22) Filed: Oct. 20, 2022

(65) Prior Publication Data

US 2023/0217800 A1 Jul. 6, 2023

(30) Foreign Application Priority Data

Dec. 31, 2021 (KR) ........................ 10-2021-0194164

(51) Int. Cl.

| | |
|---|---|
| ***H10K 77/10*** | (2023.01) |
| ***B32B 3/06*** | (2006.01) |
| ***B32B 3/30*** | (2006.01) |
| ***B32B 5/18*** | (2006.01) |
| ***B32B 7/12*** | (2006.01) |
| *B32B 27/06* | (2006.01) |
| *B32B 27/36* | (2006.01) |
| *H10K 102/00* | (2023.01) |

(52) U.S. Cl.

CPC .............. *H10K 77/111* (2023.02); *B32B 3/06* (2013.01); *B32B 3/30* (2013.01); *B32B 5/18* (2013.01); *B32B 7/12* (2013.01); *B32B 27/065* (2013.01); *B32B 27/36* (2013.01); *B32B 2307/412* (2013.01); *B32B 2307/546* (2013.01); *B32B 2457/20* (2013.01); *H10K 2102/311* (2023.02)

(58) Field of Classification Search

CPC .. H10K 77/111; H10K 2102/311; B32B 3/06; B32B 3/30; B32B 5/18; B32B 7/12; B32B 27/065; B32B 27/36; B32B 2307/412; B32B 2307/546; B32B 2457/20; B32B 2250/05; B32B 2307/42; B32B 2307/558; G06F 1/1601; G09F 9/301; G09F 9/33; C09J 7/26

See application file for complete search history.

(56) References Cited

U.S. PATENT DOCUMENTS

| | | | |
|---|---|---|---|
| 9,337,434 | B2 | 5/2016 | Lindblad |
| 9,510,470 | B2 | 11/2016 | Huitema et al. |
| 9,844,152 | B2 | 12/2017 | Heo et al. |
| 9,891,725 | B2 | 2/2018 | Lindblad |
| 9,980,402 | B2 | 5/2018 | Huitema et al. |
| 10,101,826 | B2 | 10/2018 | Lindblad |
| 10,606,379 | B2 | 3/2020 | Lindblad |

(Continued)

FOREIGN PATENT DOCUMENTS

| | | | |
|---|---|---|---|
| CN | 106030688 | A | 10/2016 |
| CN | 106463079 | A | 2/2017 |

(Continued)

*Primary Examiner* — Sahlu Okebato

(74) *Attorney, Agent, or Firm* — Birch, Stewart, Kolasch & Birch, LLP

(57) ABSTRACT

A display apparatus can include a display panel constructed so that at least a portion thereof is deformable, an apron structure supporting the display panel, and a printed circuit board electrically connected to the display panel. At least a portion of the apron structure is bendable. The apron structure includes a gap-maintaining unit disposed at the bendable portion of the apron structure.

25 Claims, 13 Drawing Sheets

(56) References Cited

U.S. PATENT DOCUMENTS

| | | | | |
|---|---|---|---|---|
| 11,216,106 | B2 | 1/2022 | Lindblad | |
| 11,740,728 | B2 | 8/2023 | Lindblad | |
| 12,197,671 | B2 | 1/2025 | Lindblad | |
| 2015/0325804 | A1* | 11/2015 | Lindblad | G06F 1/1652 313/511 |
| 2015/0357395 | A1* | 12/2015 | Cheon | H10K 59/131 257/89 |
| 2016/0374228 | A1 | 12/2016 | Park et al. | |
| 2018/0047938 | A1* | 2/2018 | Kishimoto | H10K 77/111 |
| 2018/0321764 | A1* | 11/2018 | Oh | H10K 77/111 |
| 2021/0144871 | A1* | 5/2021 | Araki | G09F 9/00 |
| 2023/0172031 | A1 | 6/2023 | Liu et al. | |

FOREIGN PATENT DOCUMENTS

| | | | |
|---|---|---|---|
| CN | 106816093 | A | 6/2017 |
| CN | 112908176 | A | 6/2021 |
| CN | 112991946 | A | 6/2021 |
| KR | 10-2016-0150253 | A | 12/2016 |
| KR | 10-2017-0005019 | A | 1/2017 |
| KR | 10-2017-0062343 | A | 6/2017 |
| KR | 10-2017-0124120 | A | 11/2017 |

* cited by examiner

DISPLAY APPARATUS

CROSS-REFERENCE TO RELATED APPLICATION

This application claims priority to and benefit of Korean Patent Application No. 10-2021-0194164 filed on Dec. 31, 2021, the entire contents of which are hereby expressly incorporated by reference into the present application.

BACKGROUND OF THE DISCLOSURE

Technical Field

The present disclosure relates to a display apparatus, and more particularly, to a display apparatus having a structure with improved durability.

Description of Related Art

As the world enters a full-fledged information era, a display apparatus that visually expresses an electrical information signal has developed rapidly. In response thereto, various display apparatuses having excellent performance, thinness, light weight, and low power consumption have been developed.

The display apparatuses include a liquid crystal display apparatus (LCD), a quantum dot (QD) display apparatus, a field emission display apparatus (FED), an electro-wetting display apparatus (EWD), an organic light-emitting display apparatus (OLED), etc.

The display apparatus can be miniaturized so that the apparatus can be carried by a user. Further, the display apparatus has been developed to be mounted on a movable apparatus such as a vehicle. Thus, the user can use the display apparatus on the vehicle more conveniently.

SUMMARY OF THE DISCLOSURE

For convenience of users, development of a display apparatus with a roll-up structure is active. The roll-up display apparatus and a display module included therein can be provided with a roll-up display portion having a flexible structure that is bent.

The roll-up display portion can have repetitive bending depending on its use. When deformation thereof due to the bending is repeated, the display portion can be damaged. Therefore, a display portion with repeated bending should have a structure that can increase durability of the display portion by suppressing damage that may be caused by the repeated deformation.

For example, in the roll-up display apparatus, an apron (also referred to herein as an apron structure) can be attached thereto to guide bending of the display portion and to guide movement thereof. The apron can serve to maintain an unfolded state in which the display portion is unfolded.

Further, the apron can play a role in increasing the durability of the display portion by suppressing excessive deformation when the display portion made of a relatively thin-film is bent.

However, since the apron is thicker than the display portion is, a load of an entirety of the display apparatus can increase or an area occupied by a combined structure of the display portion and the apron can increase.

The apron disposed on a back face of the display panel can be divided into three portions as follows: a coupling portion for coupling to one end of a bending driver for roll-up, a bent portion which is actually bent so that the display panel rolls up at a constant radius of curvature, and a fixed portion for maintaining a vertical standing state while an upper part of the display panel is not shaken.

In the present disclosure, for better understanding, the coupling portion can be referred to as a bottom apron, the bent portion as a link apron, and the fixed portion as a top apron.

Since the apron is usually heavier than the display panel, the aprons can be pre-assembled with each other and then the display panel can be attached to the assembled apron. In this way, the roll-up display apparatus can be manufactured.

However, a jig for assembling the aprons can be used because they need to be assembled with each other so that a certain spacing is formed between the aprons. The aprons can be assembled with each other using the assembling jig, and a tape can be attached thereto to maintain the spacing or temporarily fix the assembled aprons. When the display panel is attached to the apron while a non-uniform spacing is formed between the aprons, an area with a larger or smaller radius of curvature can occur locally when the roll-up display apparatus is bent or unfolded. This can apply stress to the display panel. The accumulated stress can cause damage or deformity of the display panel, which can become a defect in the roll-up display apparatus.

In the apron assembly jig process and in the step of fixing the aprons with the tape, the aprons can be misaligned or displaced. Thus, it can be difficult to maintain an equal spacing therebetween.

Further, in the process using the assembly jig, manipulation of the jig is not simple, and thus a considerable amount of time can be used.

In order to address these issues, it is useful to design the aprons which has a regular spacing therebetween while being assembled with each other without a separate jig.

A purpose of the present disclosure is to provide a display apparatus having an apron structure in which an apron can be easily assembled without using an apron assembly jig, while a uniform spacing between aprons is maintained.

Purposes of the present disclosure are not limited to the above-mentioned purpose. Other purposes and advantages of the present disclosure that are not mentioned can be understood based on following descriptions, and can be more clearly understood based on embodiments of the present disclosure. Further, it will be easily understood that the purposes and advantages of the present disclosure can be realized using means shown in the claims and combinations thereof.

A display apparatus according to an embodiment of the present disclosure includes a display panel.

A first aspect of the present disclosure provides a display apparatus including a display panel constructed so that at least a portion thereof is deformable, an apron supporting the display panel, and a printed circuit board electrically connected to the display panel, wherein at least a portion of the apron is bendable, and the apron includes gap-maintaining means (or gap-maintaining unit) disposed at the bendable portion thereof.

A second aspect of the present disclosure provides a display apparatus including a display panel; a back plate, a bottom plate and an apron supporting the display panel; and a foam-tape disposed between the bottom plate and the apron, wherein at least a portion of the apron is bendable, and the apron includes gap-maintaining means (or gap-maintaining unit) disposed at the bendable portion thereof.

The specific details of other embodiments are included in the detailed description and drawings.

The apron according to one or more embodiments of the present disclosure has a plate-shaped structure that is attached to an entirety of a rear face of the display panel and covers an entirety of the rear face of the display panel. When the roll-up display apparatus is bent or unfolded, the apron can allow the display panel to stably move without shaking.

The apron according to one or more embodiments of the present disclosure can have a structure that can be easily assembled without a separate jig during the apron assembly process.

Further, due to this structure, the aprons can be kept as being spaced from each other by a regular spacing, and the display panel may not be subjected to additional stress during bending or unfolding operation thereof. Therefore, even when the roll-up display apparatus is repeatedly bent, apparatus durability can be improved while the apparatus is supported on the apron.

In addition to the above-described effects, the specific effects of the present disclosure will be described together while describing specific details for carrying out the invention below.

Effects of the present disclosure are not limited to the above-mentioned effects, and other effects as not mentioned will be clearly understood by those skilled in the art from following descriptions.

The purposes, solutions, and effects of the disclosure as described above does not specify essential features of claims. Thus, the scope of claims is not limited by the purposes, solutions, and effects of the disclosure as described above.

BRIEF DESCRIPTION OF DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
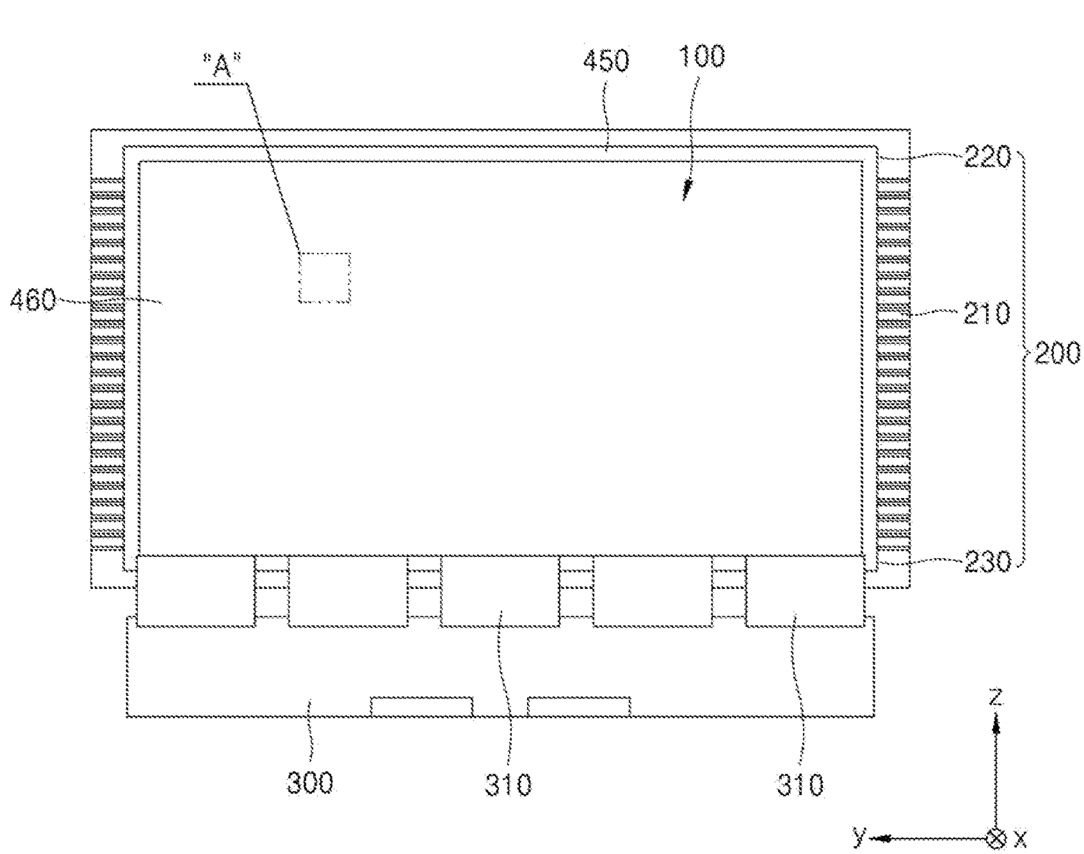
FIG. 1 is a front view showing a display module according to an embodiment of the present disclosure.

Advantages and features of the present disclosure, and how to achieve them will become apparent with reference to the embodiments described below in detail in conjunction with the accompanying drawings. However, the present disclosure is not limited to the embodiments as disclosed below, but will be implemented in a variety of different forms. Only these embodiments make the present disclosure complete, and are constructed to fully inform those having common knowledge in the technical field to which the present disclosure belongs of a scope of the disclosure. The scope of the present disclosure is only defined by the scope of the claims.

A shape, a size, a ratio, an angle, a number, etc. disclosed in the drawings for illustrating embodiments of the present disclosure are exemplary, and the present disclosure is not limited thereto. The same reference numerals refer to the same elements herein. Further, in describing the present disclosure, when it is determined that a detailed description of a related known element can unnecessarily obscure gist of the present disclosure, the detailed description thereof will be omitted. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

In interpreting a numerical value, the value is interpreted as including an error range unless there is no separate explicit description thereof.

It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present. In addition, it will also be understood that when a first element or layer is referred to as being present "on" or "beneath" a second element or layer, the first element can be disposed directly on or beneath the second element or can be disposed indirectly on or beneath the second element with a third element or layer being disposed between the first and second elements or layers.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is indicated.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

Spatially relative terms, such as "beneath," "below," "lower," "under," "above," "upper," and the like, can be used herein for ease of explanation to describe one element or feature's relationship to another element or feature as illustrated in the figures. It will be understood that the spatially relative terms are intended to encompass different orientations of the apparatus in use or in operation, in addition to the orientation depicted in the figures. For example, when the apparatus in the drawings can be turned over, elements described as "below" or "beneath" or "under" other elements or features would then be oriented "above" the other elements or features. Thus, the example terms "below" and "under" can encompass both an orientation of above and below. The apparatus can be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, a first direction refers to a vertical direction of a display apparatus in a state in which the display apparatus is installed for daily use. A second direction means a direction orthogonal to the first direction, and the third direction means a direction perpendicular to both the first direction and the second direction. Further, as used herein, a phrase "move in the first direction" and a phrase "move up or down" can have the same meaning.

A Cartesian coordinate system can be used in drawings. In the Cartesian coordinate system, a z-axis direction represents the first direction, a y-axis direction represents the second direction, and an x-axis direction represents the third direction.

As used herein, the term "display apparatus" can include, in a narrow sense, a display apparatus including a liquid crystal module (LCM), an organic light-emitting diode (OLED) module, or a quantum dot (QD) module including a display panel and a driver for driving the display panel. Moreover, the display apparatus can include, in a broad sense, a laptop computer, a television, a computer monitor, an automotive apparatus or an equipment display for a vehicle, a set electronic apparatus, or a set apparatus including a complete product or a final product including the LCM, the OLED module, or the QD module.

Therefore, the display apparatus in accordance with the present disclosure can include, in the narrow sense, a display apparatus itself including, for example, the LCM, the OLED module, QD module, etc., and can include, in a broad sense, the set apparatus as an application product or an end-user apparatus including a complete product or a final product including the LCM, the OLED module, or the QD module.

Moreover, in some cases, the LCM, OLED module, or QD module composed of the display panel and the driver can be expressed as "display apparatus" in a narrow sense. The electronic apparatus as a complete product including the LCM, OLED module or QD module can be expressed as "set apparatus" in a broad sense. For example, the display apparatus in the narrow sense can include a display panel such as a liquid crystal panel, an organic light-emitting display panel, or a quantum dot display panel, and a source PCB as a controller for driving the display panel. The set apparatus in the broad sense can include a display panel such as a liquid crystal panel, an organic light-emitting display panel, or a quantum dot display panel, a source PCB as a controller for driving the display panel, and a set PCB as a set controller that is electrically connected to the source PCB and controls the set apparatus.

As used herein, the display panel can be of any type of the display panels such as a liquid crystal display panel, an organic light emitting diode (OLED) display panel, a quantum dot (QD) display panel, and an electroluminescent display panel, etc. The display panel used in the disclosure may be not limited to a specific display panel including a flexible substrate for the OLED display panel and an underlying back plate support structure and having a bendable bezel. Moreover, the display panel used in the display apparatus according to an embodiment of the present disclosure is not limited to a shape or a size of the display panel.

More specifically, when the display panel is embodied as the organic light emitting diode (OLED) display panel, the display panel can include a plurality of gate lines and data lines, and pixels respectively formed in areas where the gate lines and the data lines intersect with each other. Moreover, the display panel can be configured to include an array including a thin-film transistor as an element for selectively applying a voltage to each pixel, an organic light-emitting element layer on the array, and an encapsulation substrate or an encapsulation layer disposed on the array to cover the organic light-emitting element layer. The encapsulation layer protects the thin-film transistor and the organic light-emitting element layer from external impact, and can prevent moisture or oxygen from penetrating into the organic light-emitting element layer. Moreover, the light emitting layer formed on the array can include an inorganic light emitting layer, for example, a nano-sized material layer, or a quantum dot. Further, all the components of each display apparatus according to all embodiments of the present disclosure are operatively coupled and configured.

FIG. 1 is a front view showing a display module 10 according to an embodiment of the present disclosure.

Referring to FIG. 1, the display apparatus according to the embodiment can include the display module 10. The display module 10 can include a display panel 100 and an apron 200. The apron 200 or any other apron of the present disclosure can be each referred to as an apron structure. The display panel 100 can be constructed so that at least a portion thereof is deformable.

The display panel 100 and the apron 200 are constructed to be coupled to each other. The display panel 100 can be made of a flexible material in which at least portion of the display panel 100 is deformable. The apron 200 can be constructed so that the at least a portion thereof is deformable or bendable, and can be combined with the display panel 100.

The apron 200 can have a structure in which at least a portion thereof is deformable so that at least a portion thereof can move integrally with the display panel 100. Each of the display panel 100 and the apron 200 can be constructed so that at least a portion thereof slides in the first direction. For example, each of the display panel 100 and the apron 200 can be constructed so that at least a portion thereof moves up or down.

To cope with this deformation, the apron 200 can include a bottom apron 230 disposed at a bottom of the display panel 100, a link apron 210 disposed at a middle region of the display panel 100 and a top apron 220 disposed at a top of the display panel 100.

The bottom apron 230 can be attached to a portion of the display panel 100, for example, can be attached to a lower side of the display panel 100 to support a lower portion of the display panel 100 and a connector 310 of a printed circuit board 300.

The link apron 210 is attached to a middle portion of the display panel 100 and slides in the first direction to support the display panel 100 well even when the display panel is bent or unfolded. For this purpose, a plurality of rod-shaped aprons can be connected to each other to form a link apron.

The top apron 220 can be attached to a portion of the display panel 100, for example, can be attached to an upper side of the display panel 100 to support and protect the upper portion of the display panel 100 while the roll-up display apparatus or the display module 10 is in an upright state. The top apron 220, the link apron 210, and the bottom apron 230 can be connected to each other.

In one example, a protective film 460 for protecting the display panel 100 can be attached to a front face of the display panel 100. For example, the protective film 460 can be embodied as an anti-scattering film that prevents the display panel 100 from being broken and scattering due to external impact for user protection.

The display panel 100 can be formed in a plate shape. A cover glass 450 can be disposed between the display panel 100 and the protective film 460. The light irradiating from the display panel 100 can pass through the cover glass 450, and thus the cover glass 450 can be made of a transparent material.

In this regard, an area of the cover glass 450 can be larger than an area of the display panel 100, so that an entirety of light emitting from the display panel 100 can pass through the cover glass 450.

In addition, the display panel 100 can be formed in a structure in which a polarizer, a bottom plate, a back plate, a foam tape and adhesive layers for bonding them to each other are stacked.

The display module 10 can further include a printed circuit board 300 having a driver circuit for controlling an operation of the display panel 100. The printed circuit board 300 can include a plurality of connectors 310 electrically connected to the display panel 100 and thus connecting the printed circuit board 300 and the display panel 100 to each other.

Various active elements, passive elements, and printed circuits constituting the driver circuit can be provided in the printed circuit board 300 and the connectors 310. In this regard, the driver circuit can be distributed over an entirety or a portion of the printed circuit board 300 and the connectors 310.

In one example, FIG. 1 shows an exploded view of the printed circuit board 300 and the connector 310 in an unfolded state. However, when the printed circuit board 300 is mounted in a housing 20 (see FIG. 10A), the connector 310 can be bent.

Further, the apron 200 can be attached to a front face of the cover glass 450 and can be disposed on an edge of the display panel 100. Accordingly, in a front view of the display apparatus, an unevenness portion 210 and a flattened portion 220 of the apron 200 cover an edge of the cover glass 110 so that the apron 200 can serve as a bezel.

This bezel has a structure that does not require a bonding structure located at an edge of the display panel 100 including the cover glass 450, so that the quality of the image or video reproduced on the display panel 100 can be improved, and the overall design quality of the display apparatus can be improved.

In the prior art, black ink constituting the bezel can be applied between the cover glass 450 and the display panel 100. The bezel is formed. To this end, the black ink is applied to the edges of the cover glass 450 and the display panel 100. At an edge of the black ink as a point where a boundary between the black ink, the cover glass 450 and the display panel 100 is located, a void is formed due to a thickness of the black ink. The void can deteriorate the quality of the display apparatus.

In an embodiment, since the bezel is made of the apron 200 instead of the black ink in the display apparatus, the black ink can be removed from the display apparatus. Further, since the apron 200 is attached to the front face of the cover glass 450, a part or a material that causes the void is not disposed between the cover glass 450 and the display panel 100. Therefore, no void is generated.

For this reason, the formation of the voids at the edge of the black ink when the bezel is made of the black ink can be suppressed. Accordingly, the quality of the display apparatus can be improved.

Figure 2:
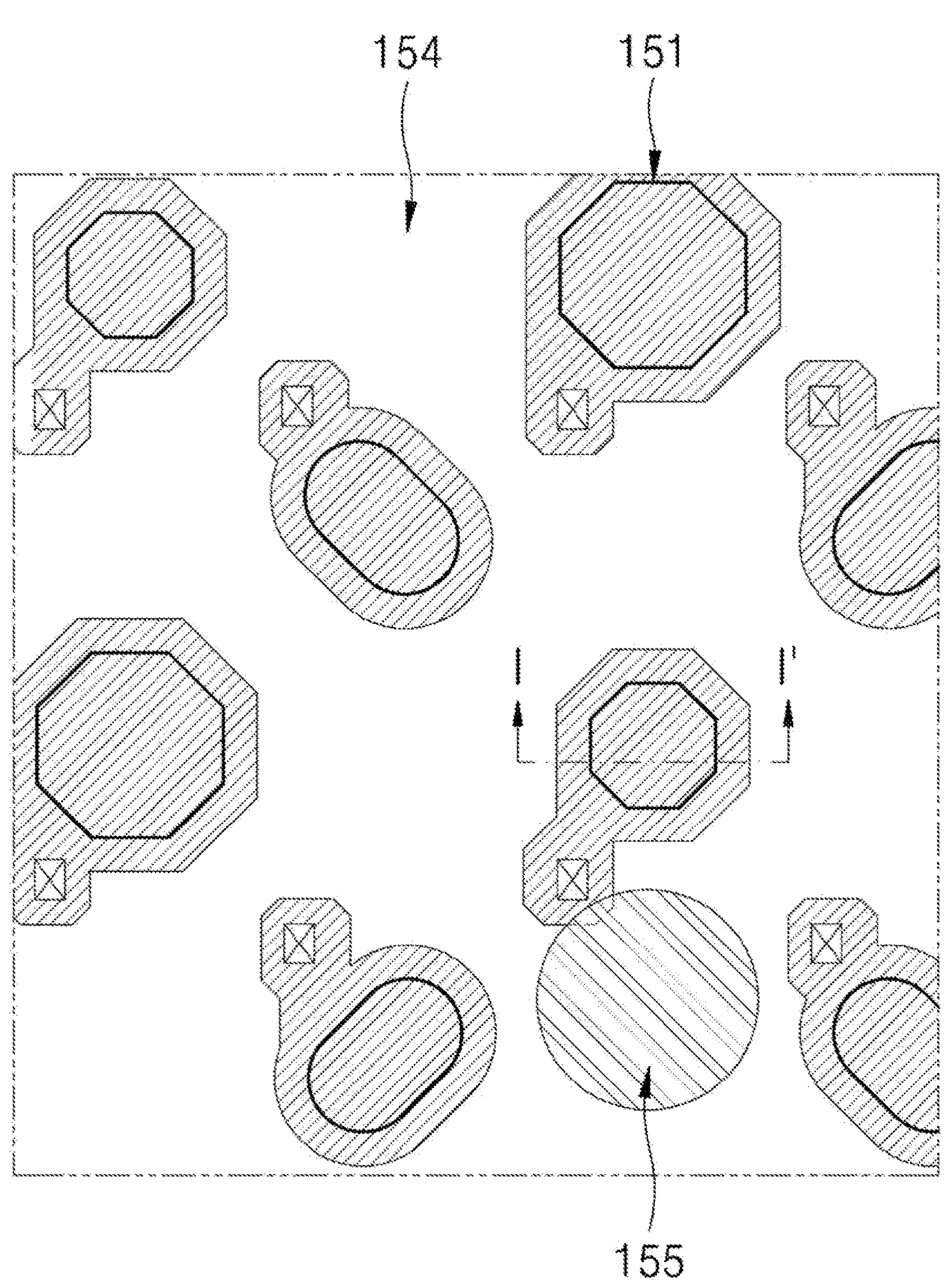
FIG. 2 is a plan view showing a display area in which an area A of FIG. 1 is enlarged.

FIG. 2 is a plan view showing a display area in which an area A of FIG. 1 is enlarged. FIG. 2 is an enlarged view of the area A which is a portion of the display panel 100 of FIG. 1, and shows a planar shape of sub-pixels arranged in a display area.

In FIG. 2, a number of anodes 151 are arranged in the display area. A bank 154 can be filled in an area between adjacent anodes 151. The bank 154 can cover an edge of the anode 151 so that only an inner area of the anode 151 contacts an organic light-emitting stack. Thus, the bank can function to define a light-emitting area of the sub-pixel. A spacer 155 can be disposed in a portion of an area where the bank 154 is disposed. The spacers 155 can be arranged at a predetermined density across the entirety of the display panel 100. The spacer 155 can serve to support a deposition mask so that the deposition mask that screens or opens an organic layer in each sub-pixel does not directly touch the display panel 100 during a deposition process to form the organic light-emitting stack. FIG. 2 exemplifies a planar structure of a Pentile Type in which the sub-pixels are arranged in a dot shape. However, the disclosure it is not limited thereto, and the planar structure of a Real Type can also be applied.

Figure 3:
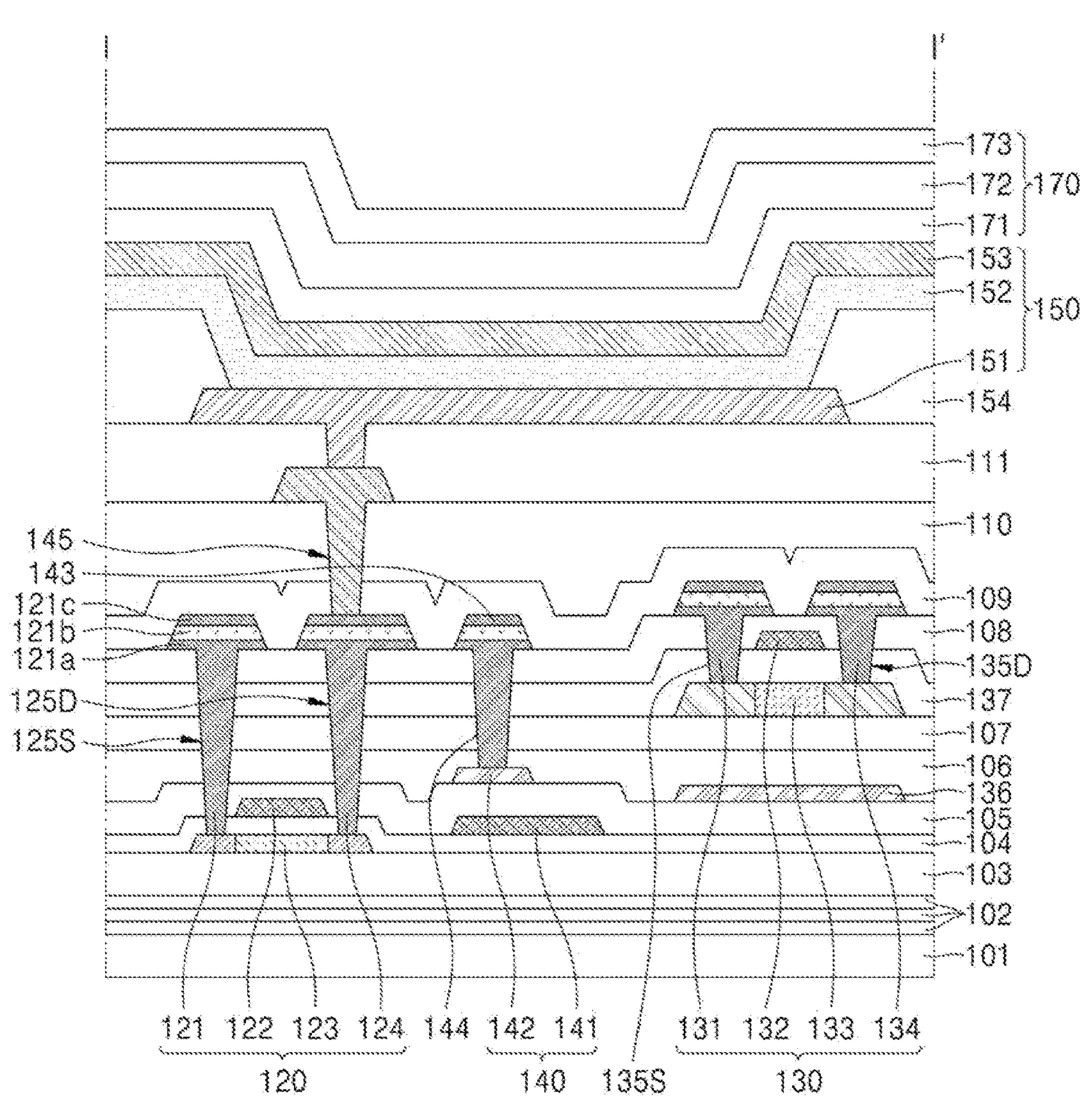
FIG. 3 is a cross-sectional view of a sub-pixel cut along I-I' in FIG. 2.

FIG. 3 shows a cross-sectional structure of the sub-pixel cut along I-I' in FIG. 2.

Referring to FIG. 3, the display apparatus can include a substrate 101, a multi buffer layer 102, and a lower buffer layer 103. A first transistor 120 can be disposed on a lower buffer layer 103. A first semiconductor layer 123 and a first gate electrode 122 constitute the first transistor 120. A lower gate insulating film 104 can be disposed on the first semiconductor layer 123 to insulate the first semiconductor layer 123 from the first gate electrode 122. A first lower interlayer insulating film 105 and a second lower interlayer insulating film 106 can be sequentially disposed on the first gate electrode 122. An upper buffer layer 107 can be disposed on the second lower interlayer insulating film 106.

The multi buffer layer 102 can delay diffusion of moisture or oxygen penetrating into the substrate 101, and can have a structure in which at least one layer made of silicon nitride ($SiN_x$) and silicon oxide ($SiO_x$) can be alternately stacked.

The lower buffer layer 103 can function to protect the first semiconductor layer 123 and block various types of defects coming from the substrate. This lower buffer layer 103 can be made of a-Si, silicon nitride ($SiN_x$), or silicon oxide ($SiO_x$).

The first semiconductor layer 123 of the first thin-film transistor 120 can be composed of a polycrystalline semiconductor layer. The first semiconductor layer 123 can include a channel area, a source area, and a drain area.

The polycrystalline semiconductor layer has higher carrier mobility than that of each of an amorphous semiconductor layer and an oxide semiconductor layer, and thus has low energy consumption and excellent reliability. Thus, the polycrystalline semiconductor layer can be used for a driving transistor.

The first gate electrode 122 can be disposed on the lower gate insulating film 104, and can be disposed to overlap the first semiconductor layer 123.

A second transistor 130 can be disposed on the upper buffer layer 107. A light-blocking layer 136 can be disposed under an area corresponding to the second transistor 130. Referring to FIG. 3, the light-blocking layer 136 can be disposed on the first lower interlayer insulating film 105 and in an area corresponding to the second transistor 130. A second semiconductor layer 133 of the second transistor 130 can be disposed on the second lower interlayer insulating film 106 and upper buffer layer 107 so as to overlap the light-blocking layer 136. An upper gate insulating film 137 for insulating a second gate electrode 132 and the second semiconductor layer 133 from each other can be disposed on the second semiconductor layer 133, and then an upper interlayer insulating film 108 can be disposed on the second gate electrode 132. Each of the first gate electrode 122 and the second gate electrode 132 can be composed of a single layer or multiple layers made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

Each of the first and second lower interlayer insulating films 105 and 106 can be composed of an inorganic film having a higher hydrogen particle content than that of the upper interlayer insulating film 108. For example, each of the first and second lower interlayer insulating films 105 and 106 can be made of silicon nitride ($SiN_x$) and can be formed using a deposition process using $NH_3$ gas. The upper interlayer insulating film 108 can be made of silicon oxide ($SiO_x$). The hydrogen particles contained in the first and second lower interlayer insulating films 105 and 106 can diffuse into the polycrystalline semiconductor layer during a hydrogenation process and thus can fill pores in the polycrystalline semiconductor layer. Accordingly, the polycrystalline semiconductor layer can be stabilized, thereby preventing deterioration of the characteristics of the first transistor 120. After activation and hydrogenation processes of the first semiconductor layer 123 of the first transistor 120, the second semiconductor layer 133 of the second transistor 130 can be formed. In this regard, the second semiconductor layer 133 can be made of an oxide semiconductor. Since the second semiconductor layer 133 is not exposed to high-temperature atmosphere of the activation and hydrogenation process of the first semiconductor layer 123, damage to the second semiconductor layer 133 can be prevented and reliability thereof can be improved. After the upper interlayer insulating film 108 is disposed, a first source contact-hole 125S and a first drain contact-hole 125D can be formed to correspond to source and drain areas of the first transistor, respectively, and a second source contact-hole 135S and a second drain contact-hole 135D can be formed to correspond to source and drain areas of the second transistor 130, respectively.

Referring to FIG. 3, the first source contact-hole 125S and the first drain contact-hole 125D can extend continuously from the upper interlayer insulating film 108 and the lower gate insulating film 104. The second source contact-hole 135S and the second drain contact-hole 135D for the second transistor 130 can extend continuously through the upper gate insulating film 137 and the upper interlayer insulating film 108. The first source electrode 121 and the first drain electrode 124 corresponding to the first transistor 120, and the second source electrode 131 and the second drain electrode 134 corresponding to the second transistor 130 can be formed at the same time. Thus, the number of processes for forming the source and drain electrodes of the first transistor 120 and the second transistor 130 can be reduced.

Each of the first source and drain electrodes 121 and 124 and the second source and drain electrodes 131 and 134 can be composed of a single layer or multiple layers made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto. Each of the first source and drain electrodes 121 and 124 and the second source and drain electrodes 131 and 134 can have a three-layer structure. For example, the first source electrode 121 can be composed of a first layer 121*a*, a second layer 121*b*, and a third layer 121*c*. Each of other source and drain electrodes can have the same structure.

A storage capacitor 140 can be disposed between the first transistor 120 and the second transistor 130. As shown in FIG. 3, the storage capacitor 140 can be formed by stacking a storage lower electrode 141 and a storage upper electrode 142 while the first lower interlayer insulating film 105 is interposed therebetween.

The storage lower electrode 141 can be located on the lower gate insulating film 104, and can be made of the same material as that of the first gate electrode 122 and can be formed in the same layer as a layer in which the first gate electrode 122 is disposed. The storage upper electrode 142 can be electrically connected to a pixel circuit via a storage supply line 143. The storage upper electrode 142 can be made of the same material as that of the light-blocking layer 136. The storage upper electrode 142 is exposed to the storage contact-hole 144 extending through the second lower interlayer insulating film 106, the upper buffer layer 107, the upper gate insulating layer 137, and the upper interlayer insulating film 108, and is connected to the storage supply line 143. In one example, the storage upper electrode 142 is spaced apart from the light-blocking layer 136 as shown in FIG. 3.

Alternatively, the storage upper electrode 142 and the light-blocking layer 136 can be formed in an integrated manner to each other. The storage supply line 143 can be made of the same material as that of each of the first source and drain electrodes 121 and 124 and the second source and drain electrodes 131 and 134, and can be coplanar therewith. For this reason, the storage supply line 143, the first source and drain electrodes 121 and 124 and the second source and drain electrodes 131 and 134 can be formed simultaneously in the same mask process.

An inorganic insulating material such as $SiN_x$ or $SiO_x$ can be deposited on the substrate 101 on which the first source and drain electrodes 121 and 124, the second source and drain electrodes 131 and 134, and the storage supply line 143 have been formed. Thus, a protective film 109 can be formed. A first planarization layer 110 can be formed on the substrate 101 on which the protective film 109 has been formed. Specifically, the first planarization layer 110 can be formed by applying an organic insulating material such as acrylic-based resin on the protective film 109 over an entirety of the substrate 101.

The protective film 109 and the first planarization layer 110 are disposed. Then, a contact-hole exposing the first source electrode 121 or the first drain electrode 124 of the first transistor 120 can be formed using a photolithography process. A connective electrode 145 can fill the contact-hole area exposing the first drain electrode 124 and can be made of a material made of Mo, Ti, Cu, AlNd, Al and Cr or an alloy thereof.

A second planarization layer 111 can be disposed on the connective electrode 145. A contact-hole exposing the connective electrode 145 can be formed in the second planarization layer 111. A light emitting element 150 connected to the first transistor 120 can be formed thereon.

The light emitting element 150 can include an anode electrode 151 connected to the first drain electrode 124 of the first transistor 120, at least one organic light-emitting stack 152 formed on the anode electrode 151, and a cathode electrode 153 formed on the organic light-emitting stack 152.

The organic light-emitting stack 152 can include a hole injection layer, a hole transport layer, a light-emitting layer, an electron transport layer, and an electron injection layer. In a tandem structure in which a plurality of light-emitting layers overlap each other, a charge generating layer can be additionally disposed between adjacent light-emitting layers. In the light-emitting layer, different colors can be emitted from different sub-pixels. For example, a light-emitting layer for red, a light-emitting layer for green, and a light-emitting layer for blue can constitute different sub-pixels. However, a common light-emitting layer is formed to emit white light in each sub-pixel, and different color filters that correspond to different colors can be provided separately. The arrangement can include RGB type (Real RGB Type) and WOLED (White OLED). The light-emitting layer can be individually formed per sub-pixel, while the injection layer or the transport layer can be provided as a common layer and can be common to the sub-pixels.

The anode electrode 151 can be connected to the connective electrode 145 via a contact-hole extending through the second planarization layer 111. The anode electrode 151 can be formed in a multi-layer structure including a transparent conductive film and an opaque conductive film having high reflection efficiency. The transparent conductive film can be made of a material having a relatively higher work function value, such as indium-tin-oxide (ITO) or indium-zinc-oxide (IZO). The opaque conductive film can be composed of a single-layer or multi-layer structures made of Al, Ag, Cu, Pb, Mo, Ti or alloys thereof. For example, the anode electrode 151 can be formed in a structure in which a transparent conductive film, an opaque conductive film, and a transparent conductive film are sequentially stacked, or in a structure in which a transparent conductive film and an opaque conductive film are sequentially stacked. The anode electrode 151 can be disposed on the second planarization layer 111 so as to overlap not only the light-emitting area defined by the bank 154 but also a pixel circuit area in which the first and second transistors 120 and 130 and the storage capacitor 140 are disposed. Thus, a light emission area can be increased.

The organic light-emitting stack 152 can be formed by stacking a hole transport layer, an organic light-emitting layer, and an electron transport layer on the anode electrode 151 in this order or in a reverse order thereto. Alternatively, the organic light-emitting stack 152 can include first and second light-emitting stacks while a charge generation layer is disposed therebetween.

The bank 154 can be formed to expose the anode electrode 151. This bank 154 can be made of an organic material such as photo acrylic, and can be made of a translucent material. However, the disclosure is not limited thereto, and the bank can be made of an opaque material to prevent light interference between sub-pixels.

The cathode electrode 153 can be formed on a top face of the organic light-emitting stack 152 so as to face the anode electrode 151 while the organic light-emitting stack 152 is interposed therebetween. In a top emission type organic light-emitting display apparatus, the cathode electrode 153 can be composed of a transparent conductive thin film made of indium-tin-oxide (ITO), indium-zinc-oxide (IZO), or magnesium-silver (Mg—Ag).

An encapsulation layer 170 for protecting the light-emitting element 150 can be formed on the cathode electrode 153. Since the light-emitting element 150 reacts with external moisture or oxygen due to characteristics of the organic material of the organic light-emitting stack 152, dark-spot or pixel shrinkage can occur. To solve this problem, the encapsulation layer 170 for protecting the light-emitting element 150 can be formed on the cathode electrode 153. The encapsulation layer 170 can be composed of a stack of a first inorganic insulating film 171, a foreign material compensation layer 172, and a second inorganic insulating film 173.

A touch unit can be disposed on the encapsulation layer 170. The touch unit can include a first touch planarization layer, a touch electrode, and a second touch planarization layer. The first touch planarization layer and the second touch planarization layer can eliminate a step at a position where the touch electrode is disposed and can perform electrical insulation.

Figure 4:
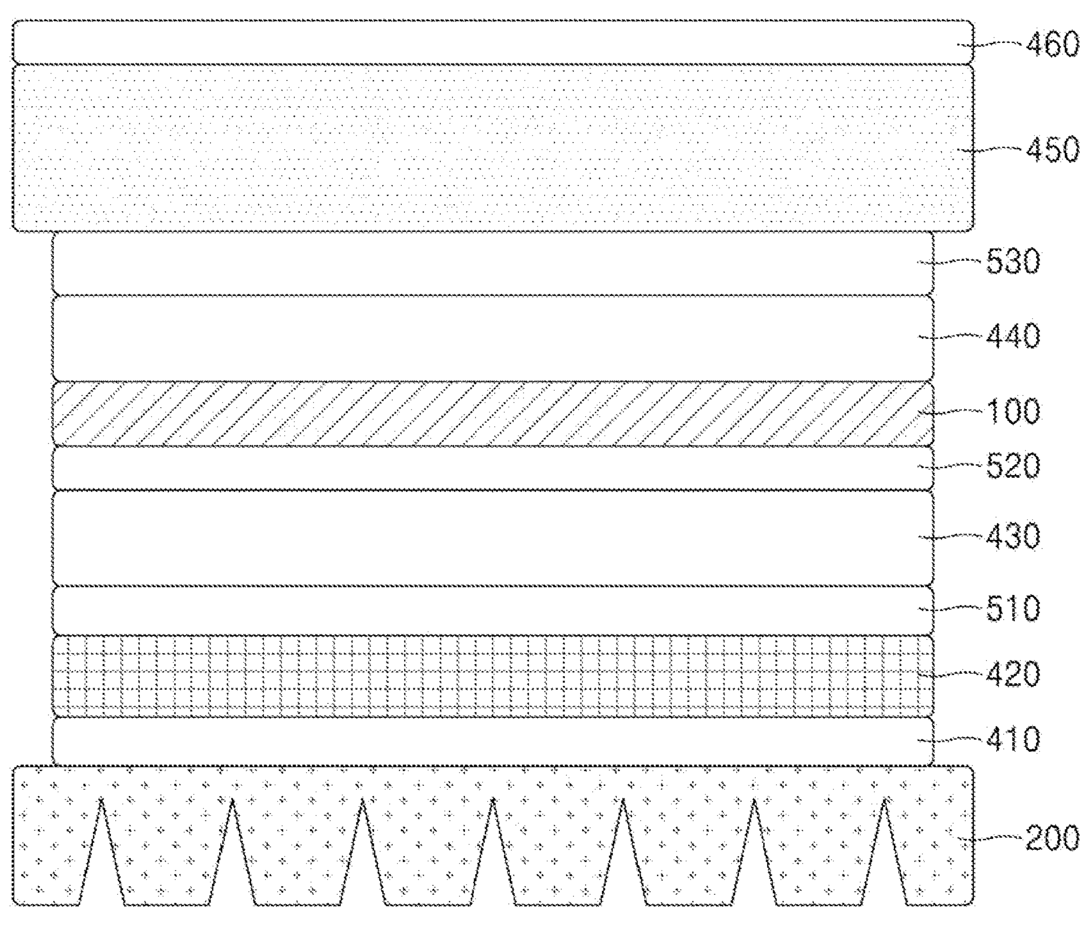
FIG. 4 is an enlarged view of a cross section of a display module in FIG. 1.

FIG. 4 shows a cross-sectional view of constituent layers disposed above and below the display panel 100 in the display module 10.

Referring to FIG. 4, the apron 200 is disposed under a foam-tape 410. The foam-tape 410 can be attached to one face of the apron 200. The foam-tape 410, a bottom plate 420, a first adhesive layer 510, a back plate 430, and a second adhesive layer 520 can be sequentially disposed on the apron 200. As described above, the apron 200 can be configured to allow the display module 10 to be uniformly bent and unfolded on a region basis when the display module 10 is bent and unfolded.

Referring to FIG. 4, the cross section of the apron 200 can be shaped so that one face thereof adjacent to the display panel 100 can be kept as flat as possible, and the other face thereof can have a trapezoidal shape formed by removing a portion thereof. When the portion of the other face of the apron 200 is removed as shown in the cross section in FIG. 4, the display panel 100 can be rolled into a cylindrical shape or can be bent or stretched.

The foam-tape 410 can play a role in allowing the apron 200 to be maintained at a predetermined position or spacing while not being deformed. The bottom plate 420 can be disposed on the foam-tape 410, and the first adhesive layer 510 can be disposed on the bottom plate 420. The bottom plate 420 can act to absorb tensile and compressive stresses applied to the display panel 100 when the apron 200 is bent or unfolded.

The bottom plate 410 may, for example, be made of a rigid plastic, and can be made of a light and transparent material such as polyethylene terephthalate (PET).

The first adhesive layer 510 can include a black dye to block light emitted from the display panel 100. The first adhesive layer 510 with black dye absorbs and blocks the light emitted from the display panel 100, and can prevent the light from spreading throughout the display module 10 along with the adhesive function.

The back plate 430, the second adhesive layer 520, and the display panel 100 have been attached to each other from start of manufacturing process of the display panel 100. In other words, the display panel 100 can be manufactured in a state in which the second adhesive layer 520 has been already attached to the back plate 430, and the substrate 101 has been already attached to the second adhesive layer 520 during the process of manufacturing the display panel 100.

The polarizing film 440, the third adhesive layer 530, the cover glass 450, and the protective film 460 can be sequentially stacked on the display panel 100.

The polarizing film 440 can be disposed to prevent external light incident on and reflected from the display panel 100 from being visible to the user's field of view. The cover glass 450 can be embodied as a glass or plastic substrate to protect the display panel 100. The cover glass 450 can be mainly made of glass. With the development of technology, a glass substrate that can be folded or bent has been developed and is being applied in various ways.

The protective film 460 can protect the display panel 100 and the cover glass 450. For example, when the display panel 100 or the cover glass 450 is damaged by an external impact, resulting fragments can scatter and cause injury to the user. In order to prevent scattering of the fragments of the display panel 100 or the cover glass 450, the protective film 460 can primarily absorb shock and can secondarily have adhesiveness and durability to hold the fragments to prevent the scattering of the fragments.

Figure 5:
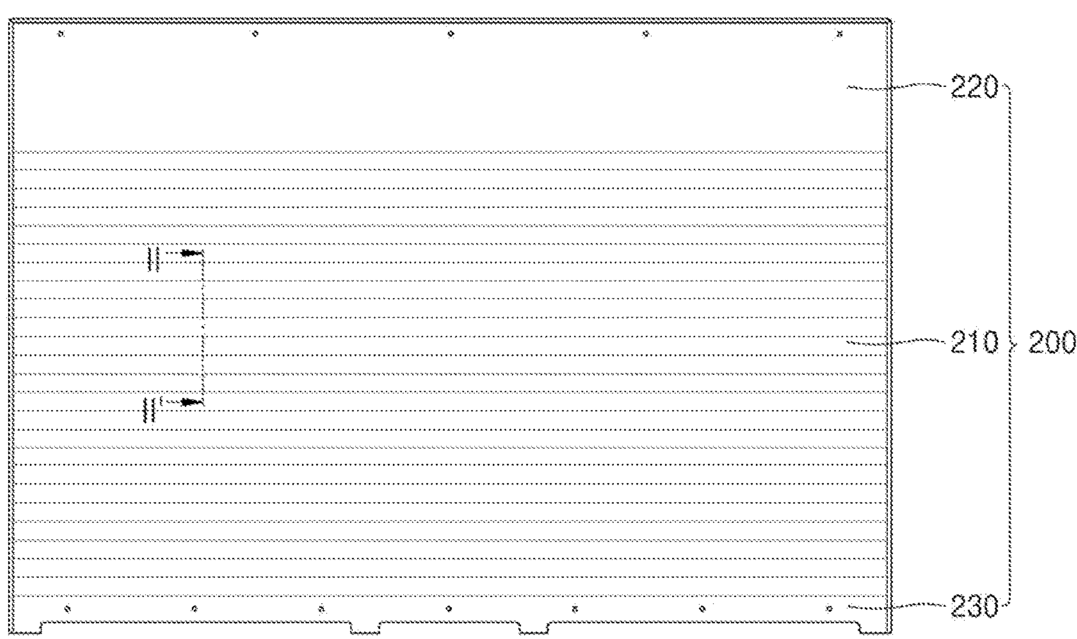
FIG. 5 is a plan view showing a plane of an apron according to an embodiment of the present disclosure.

FIG. 5 is a plan view showing an assembled plane of the apron 200.

Referring to FIG. 5, the bottom apron 230 and the top apron 220 can constitute a top and a bottom of the apron, respectively, while the link apron 210 can be disposed between the bottom apron 230 and the top apron 220.

At least a portion of the link apron 210 can have a trapezoidal cross section so that the display panel 100 can be partially folded when the display panel 100 is bent or unfolded.

Figure 6:
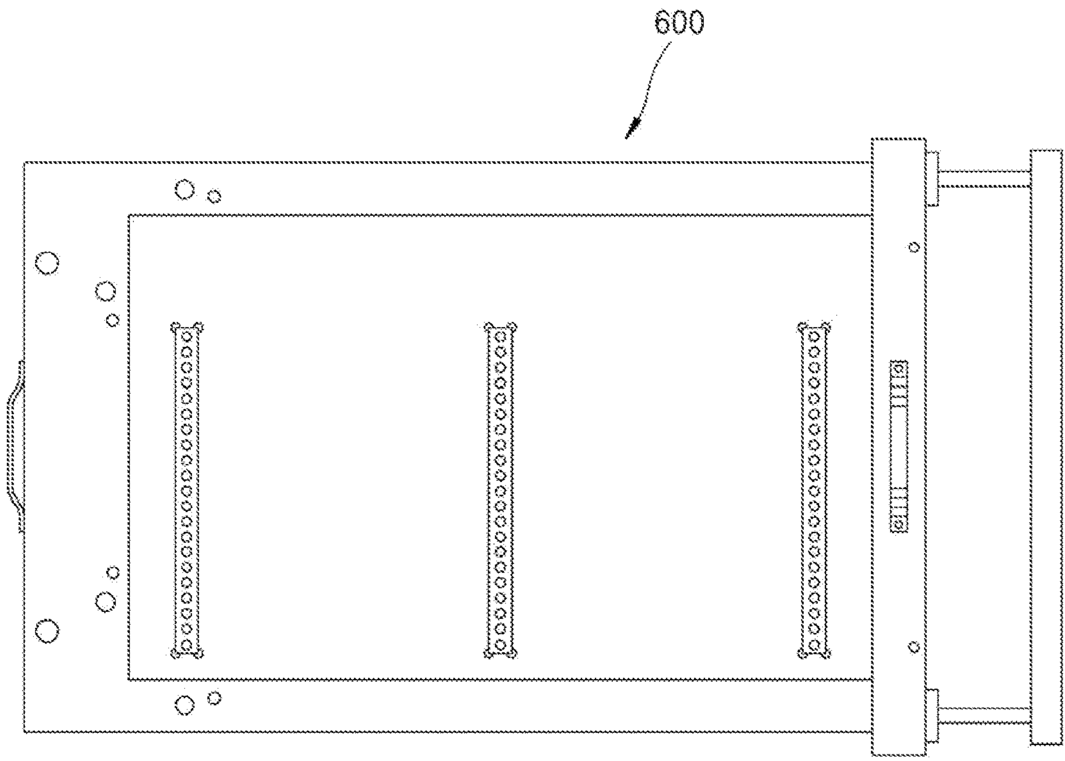
FIG. 6 is a view showing a jig for assembling an apron.

FIG. 6 shows a jig 600 for assembling the apron 200.

Referring to FIG. 6, a frame for assembling the apron 200 in FIG. 5 is provided. The bottom apron 230 and the top apron 220 can be respectively disposed on upper and lower portions of the jig. A fixing frame can fix the plurality of link aprons 210 having a bar shape. The link apron 210 can be constructed so that a plurality of apron pieces are arranged to be spaced from each other by a predetermined spacing. Thus, the fixing frame capable of aligning the plurality of apron pieces with each other is necessary.

To assemble the apron 200, individual aprons can be disposed on the jig of FIG. 6, and the foam-tape 410 can be attached to a top of the assembled apron 200. Thus, a first assembly of the apron 200 can be completed. However, even when the apron 200 is well aligned with the jig during actual work, the positions of the apron pieces are misaligned with each other in the process of attaching the foam-tape 410 thereto, or an operator's mistake. Accordingly, the assembly process without using the jig is required when assembling the apron 200.

At least a portion of the apron 200 can be bent. In this regard, a gap-maintaining means (or unit) can be present at a bent portion or bendable portion of the apron 200. The bent portion of the apron 200 can be divided into a plurality of pieces. When the apron is bent, a spacing between adjacent ones of the plurality of pieces can increase or decrease. The gap-maintaining means (gap-maintaining unit) can be disposed at a position at which adjacent ones of the plurality of pieces are connected to each other. The gap-maintaining means can include a gap-maintaining hole 211 and a gap-maintaining pin 212 (see FIG. 7A).

Figure 7A:
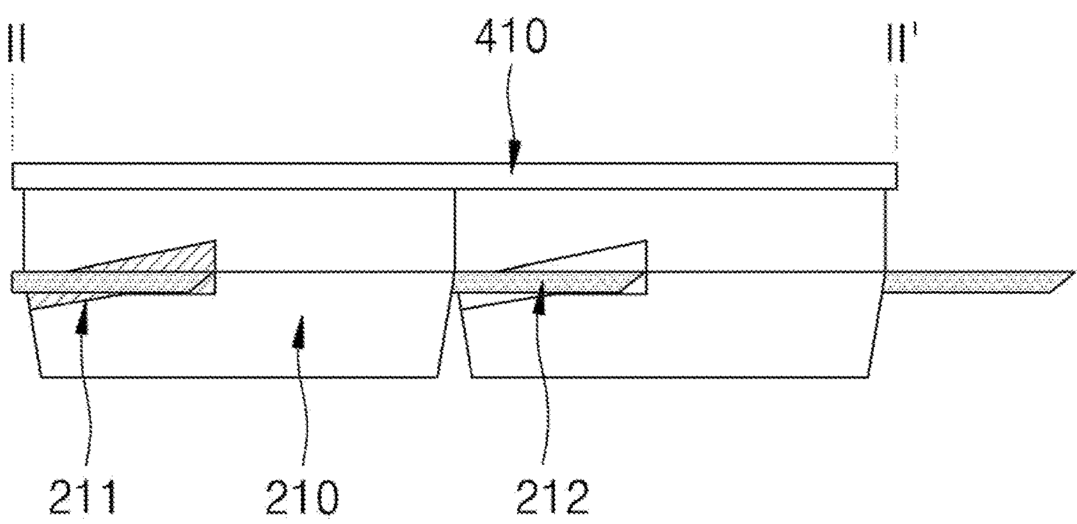
FIG. 7A and FIG. 7B are cross-sectional views showing a cross section of an apron according to an embodiment of the present disclosure.
Figure 7B:
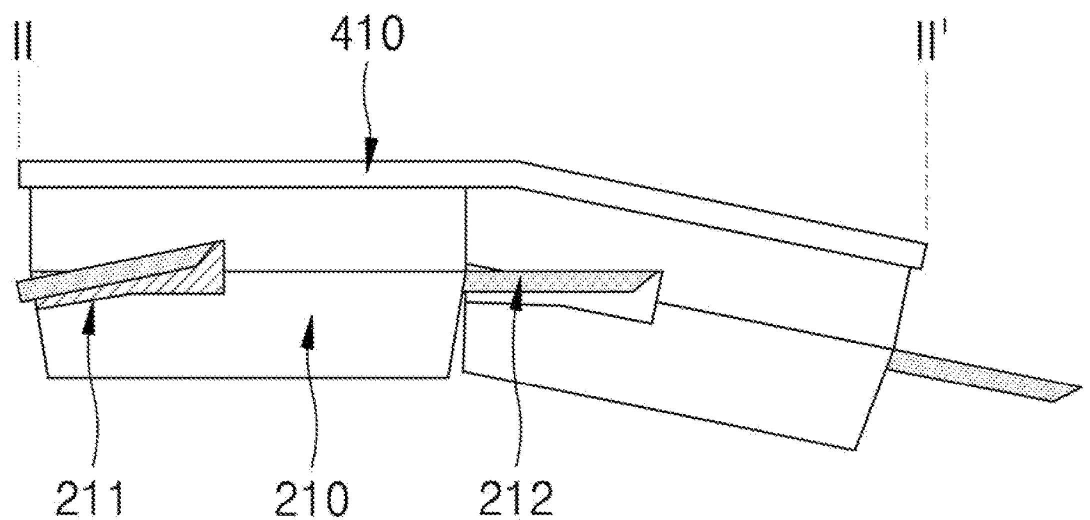

FIG. 7A and FIG. 7B are cross-sectional views according to an embodiment of the present disclosure, and show an II-II' section of FIG. 5.

Referring to FIG. 7A, a plurality of link apron 210 are arranged consecutively. The foam-tape 410 is disposed on a top of the link aprons 210. In a cross sectional view of the link aprons 210, the gap-maintaining hole 211 can be formed on one side thereof, while the gap-maintaining pin 212 can be formed on the other side thereof.

Referring to FIG. 7A, the gap-maintaining hole 211 is formed inwardly of the link apron 210 to provide a space in which the gap-maintaining pin 212 is received. Due to the gap-maintaining hole 211 and the gap-maintaining pin 212 of the link apron 210, the apron 200 can be assembled to have a predetermined gap without a separate apron assembly jig. The gap-maintaining pin 212 can be manufactured to have a predetermined length and a predetermined vertical dimension. The gap-maintaining hole 211 can be formed to have a predetermined length which is smaller than that of the gap-maintaining pin 212. A vertical dimension of the gap-maintaining hole 211 can be larger than that of the gap-maintaining pin 212.

Since the vertical dimension of the gap-maintaining hole 211 is equal to or greater than the vertical dimension of the gap-maintaining pin 212, the gap-maintaining pin 212 can easily enter the gap-maintaining hole 211. Since the gap-maintaining hole 211 is shorter than the gap-maintaining pin 212, a predetermined gap can be maintained. Thus, the link apron 210 can be assembled without a separate jig.

The gap-maintaining hole 211 can have an inner bent face. As can be identified from FIG. 7A to FIG. 7B, the bent face can be bent at an obtuse angle.

FIG. 7A is a cross-section of the apron 200 in a flat state while the display module 10 is unfolded, while FIG. 7B is a cross-section of the apron 200 in a bent state while the display module 10 is bent.

Referring to FIG. 7B, it can be identified that the link apron 210 is bent at a predetermined angle. A bending angle of the link apron 210 can be determined based on the gap-maintaining hole 211 and the gap-maintaining pin 212. In particular, the bending angle of the link apron 210 can be determined based on an angle of the bent face of the gap-maintaining hole 211 and the length and a thickness of the gap-maintaining pin 212 corresponding thereto, as described above.

The foam-tape 410 disposed on the top of the link apron 210 can prevent a gap of the link apron 210 from increasing when the apron is bent.

Figure 8A:
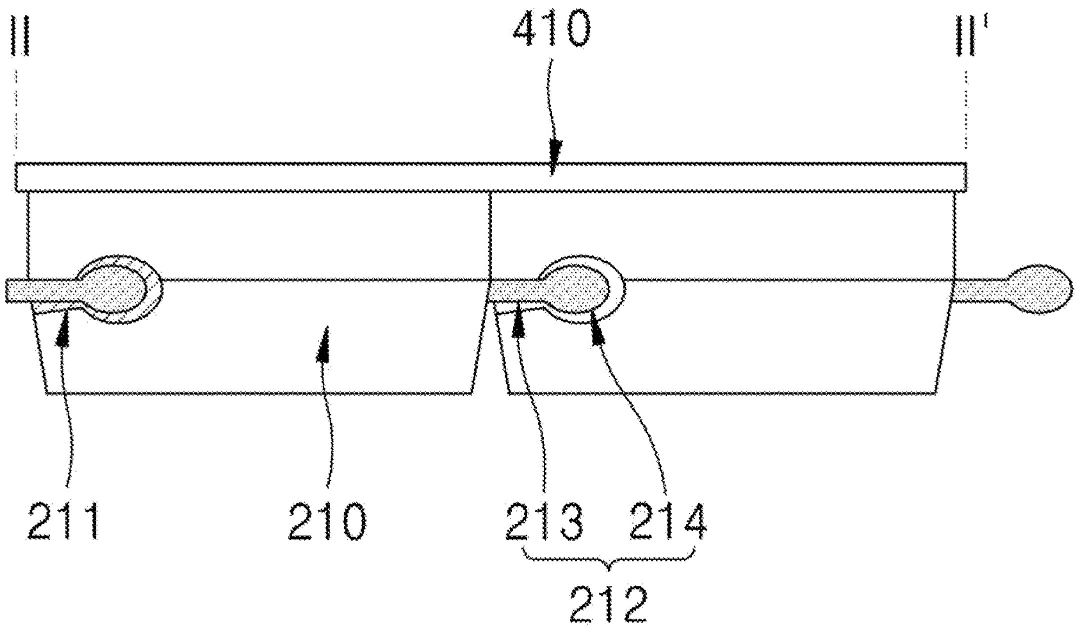
FIG. 8A and FIG. 8B are cross-sectional views showing a cross section of an apron according to another embodiment of the present disclosure.
Figure 8B:
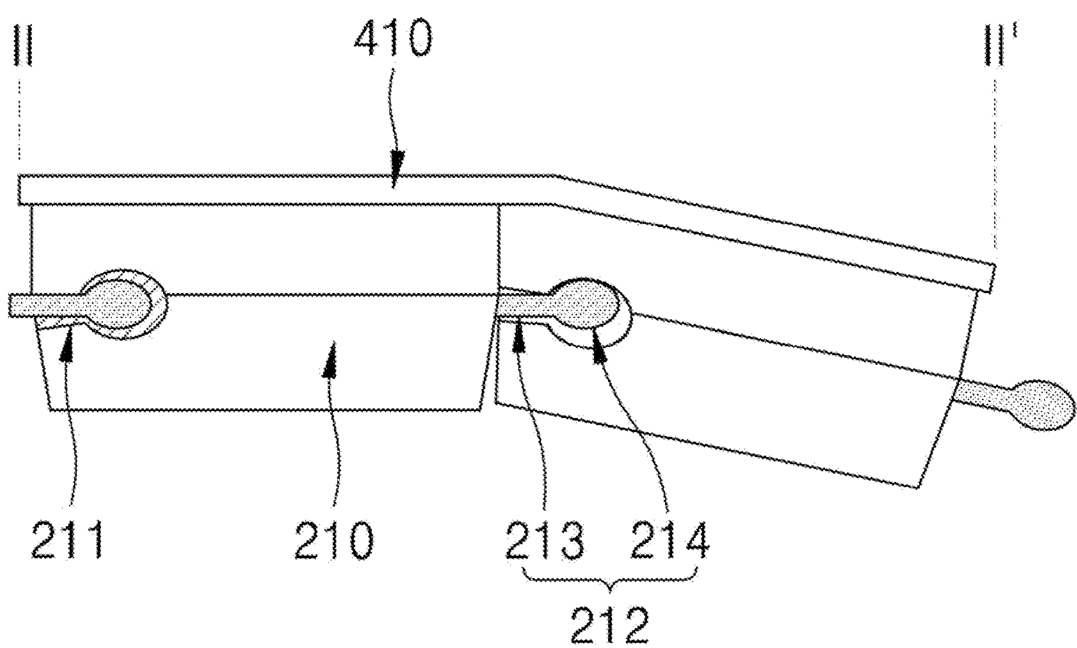

FIG. 8A and FIG. 8B are cross-sectional views according to another embodiment of the present disclosure, and show a II-II' section of FIG. 5.

Referring to FIG. 8A, a plurality of link aprons 210 are arranged consecutively. The foam-tape 410 is disposed on a top of the link aprons 210. In a cross sectional view of the link aprons 210, the gap-maintaining hole 211 can be formed on one side thereof, while the gap-maintaining pin 212 can be formed on the other side thereof. Referring to FIG. 8A, the gap-maintaining hole 211 is formed inwardly of the link apron 210 to provide a space in which the gap-maintaining pin 212 is received. Due to the gap-maintaining hole 211 and the gap-maintaining pin 212 of the link apron 210, the apron 200 can be assembled to have a predetermined gap without a separate apron assembly jig. The gap-maintaining hole 211 can have an inner bent face. As can be identified from FIG. 8A to FIG. 8B, the bent face can be bent at an obtuse angle. Unlike FIG. 7A to FIG. 7B, in the gap-maintaining hole 211 of FIG. 8A to FIG. 8B, a portion of the bent face can be straight, but the other portion thereof can be circular. The bent face is bent at a position between the straight and curved portions.

The gap-maintaining pin 212 can include a gap-maintaining extension 213 and a gap-maintaining head 214. The gap-maintaining head 214 can be elliptical. The gap-maintaining head 214 can enter a circular hole along the bent face of the gap-maintaining hole 211.

Referring to FIG. 8A, the gap-maintaining hole 211 is formed inwardly of the link apron 210 to provide a space in which the gap-maintaining pin 212 is received. Due to the gap-maintaining hole 211 and the gap-maintaining pin 212 of the link apron 210, the apron 200 can be assembled to have a predetermined gap without a separate apron assembly jig. The gap-maintaining head 214 of the gap-maintaining pin 212 can be formed in an elliptical shape having a predetermined length and a predetermined vertical dimension. The gap-maintaining hole 211 can be formed to have a predetermined length and a circular hole. The length of the gap-maintaining hole 211 can be smaller than or equal to that of the gap-maintaining pin 212, and the vertical dimension of the gap-maintaining hole 211 can be larger than that of the gap-maintaining pin 212. In particular, a vertical dimension of a bent portion of the gap-maintaining hole 211 can be greater than or equal to that of the gap-maintaining head 214 of the gap-maintaining pin 212.

The vertical dimension of the bent portion of the gap-maintaining hole 211 is equal to or slightly greater than the vertical dimension of the gap-maintaining head 214 of the gap-maintaining pin 212, so that the gap-maintaining pin 212 can enter the gap-maintaining hole 211. Since the gap-maintaining hole 211 is shorter than the gap-maintaining pin 212, a predetermined gap can be maintained. Thus, the link apron 210 can be assembled without a separate jig.

FIG. 8A is a cross section of the apron 200 in a flat state while the display module 10 is unfolded, while FIG. 8B is a cross section of the apron 200 in a bent state while the display module 10 is bent.

Referring to FIG. 8B, it can be identified that the link apron 210 is bent at a predetermined angle. The bending angle of the link apron 210 can be determined based on the gap-maintaining hole 211 and the gap-maintaining pin 212. In particular, the bending angle of the link apron 210 can be determined based on the angle of the bent face of the gap-maintaining hole 211 and the length and a thickness of the gap-maintaining pin 212 corresponding thereto as described above. The vertical dimension of the bent portion of the gap-maintaining hole 211 is equal to or slightly greater than the vertical dimension of the gap-maintaining head 214 of the gap-maintaining pin 212, so that the gap-maintaining head 214 may not easily come out of the gap-maintaining hole 211.

Figure 9:
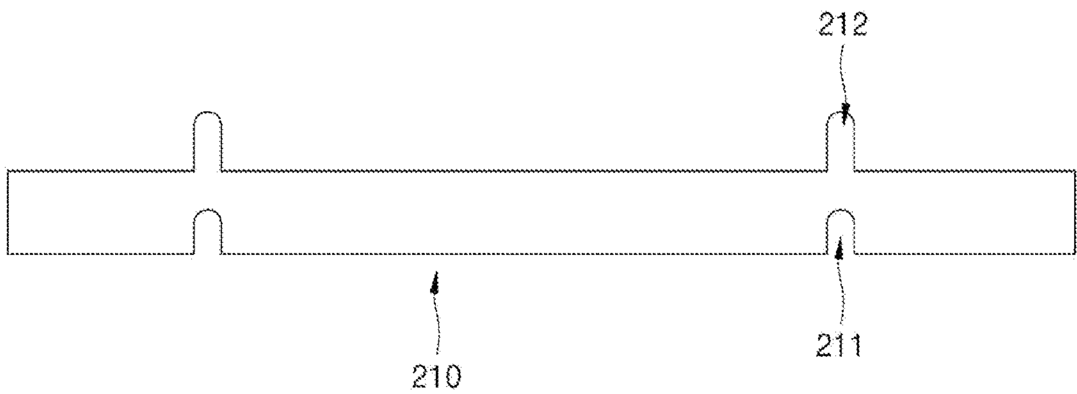
FIG. 9 is a plan view showing a plane of a single link apron according to an embodiment of the present disclosure.

FIG. 9 is a plan view showing a planar structure of the link apron 210 according to an embodiment of the present disclosure.

Referring to FIG. 9, it can be identified that the link apron 210 has two gap-maintaining pins 212 and two gap-maintaining holes 211 corresponding thereto at two positions, respectively. Although the gap-maintaining pin 212 is shown in a bar shape, the disclosure is not limited thereto. The gap-maintaining pin 212 having an elliptical head in FIG. 8A to FIG. 8B can be applied. Similarly, the gap-maintaining hole 211 is shown in a bar shape. However, the present disclosure is not limited thereto, and the gap-maintaining hole 211 having an elliptical hole in FIG. 8A to FIG. 8B can be applied.

Further, each of the top apron 220 and the bottom apron 230 can have at least one gap-maintaining pin 212 and at least one gap-maintaining hole 211. Thus, each of the top apron 220 and the bottom apron 230 can be connected to the link apron 210 via the gap-maintaining pin 212 and the gap-maintaining hole 211. The link apron 210 can include a plurality of gap-maintaining pins 212 and a plurality of gap-maintaining holes 211. For example, the gap-maintaining pin 212 can be disposed at the top apron 220 and thus can be connected to the gap-maintaining hole 211 of the link apron 210. The gap-maintaining hole 211 can be formed in the bottom apron 230 and thus the gap-maintaining pin 212 of the link apron 210 can be connected thereto.

Figure 10A:
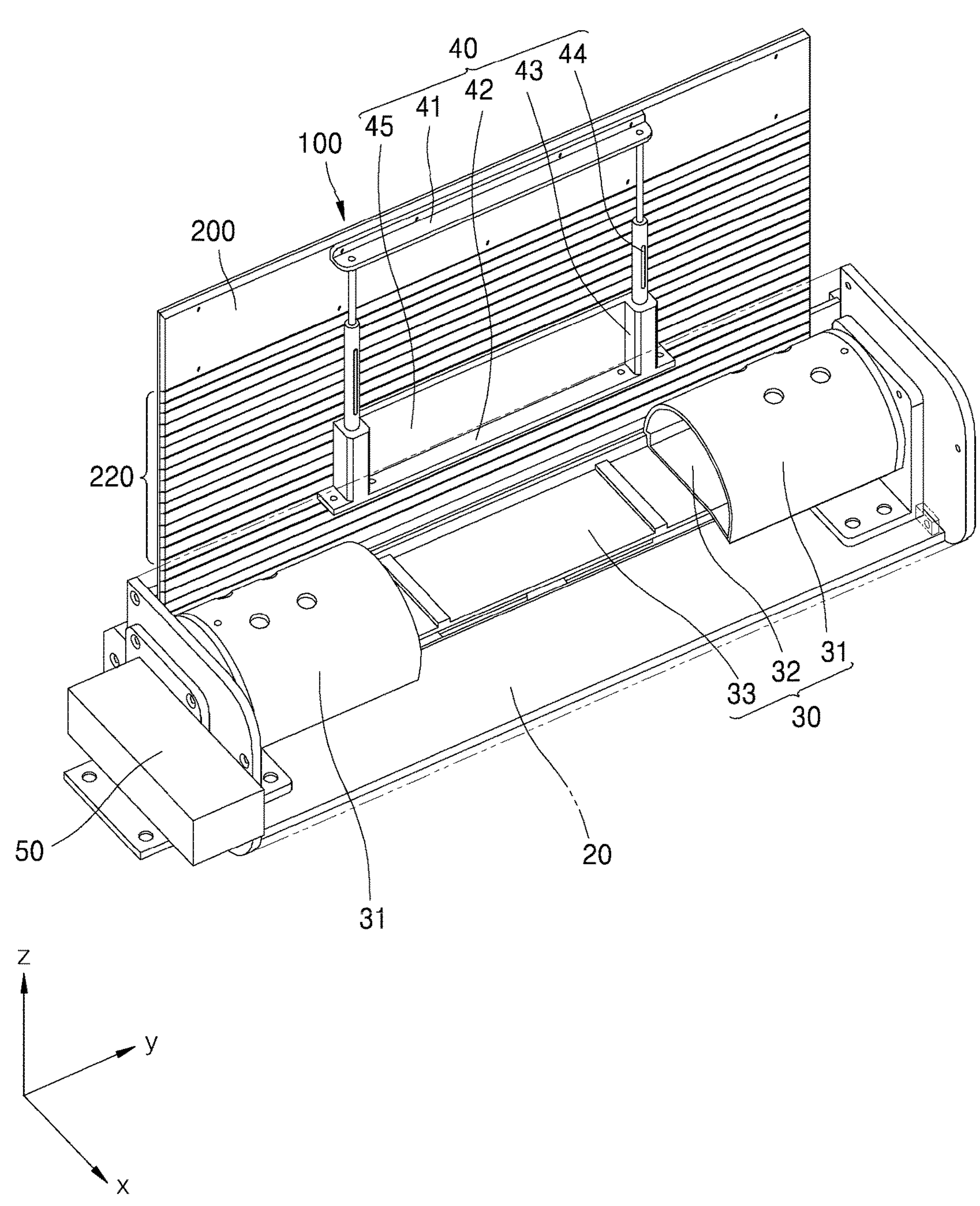
FIG. 10A to FIG. 10C are diagrams showing a state in which a display module and an apron to which an embodiment of the present disclosure is applied are attached to a housing and move.
Figure 10B:
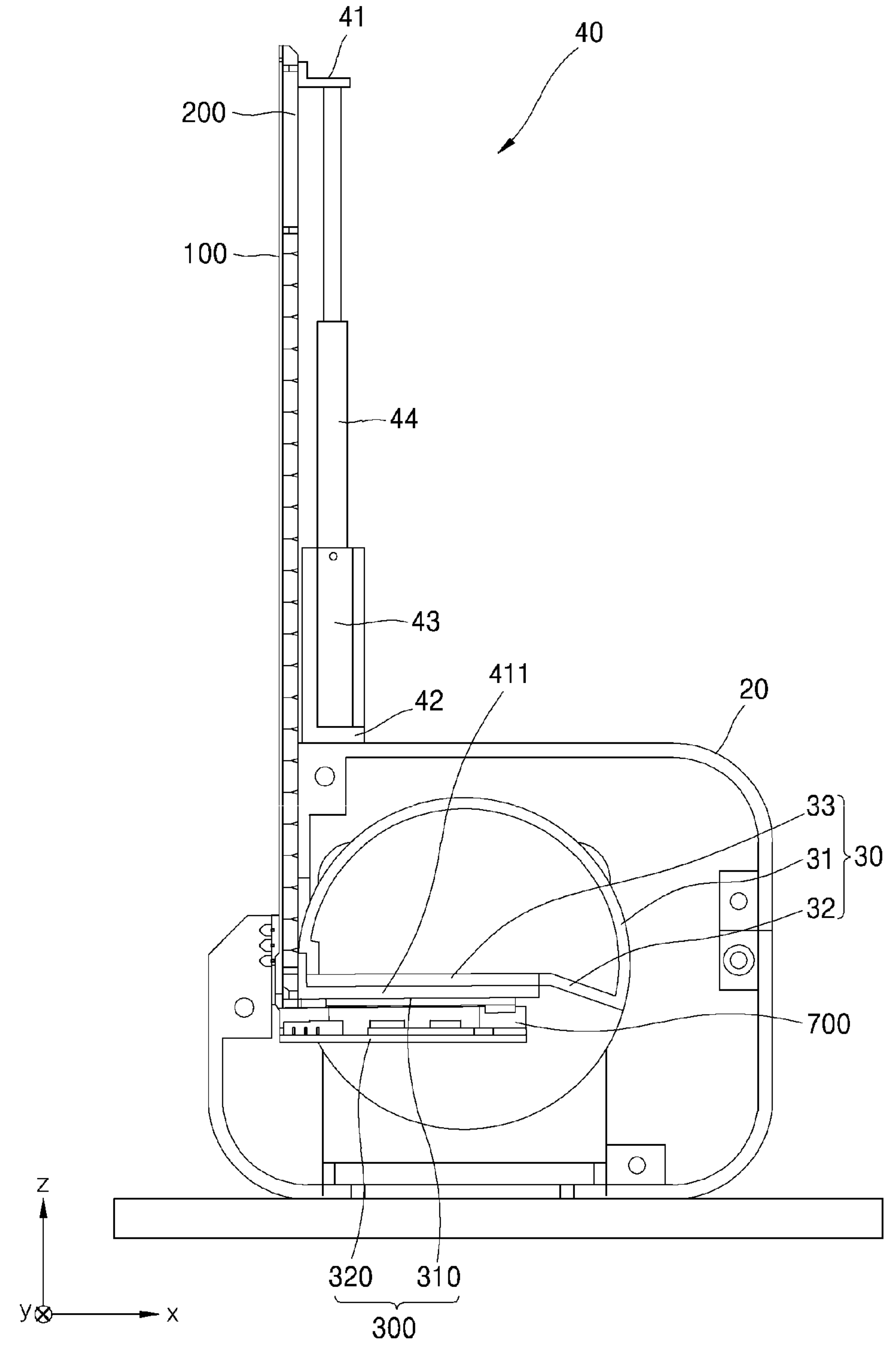
Figure 10C:
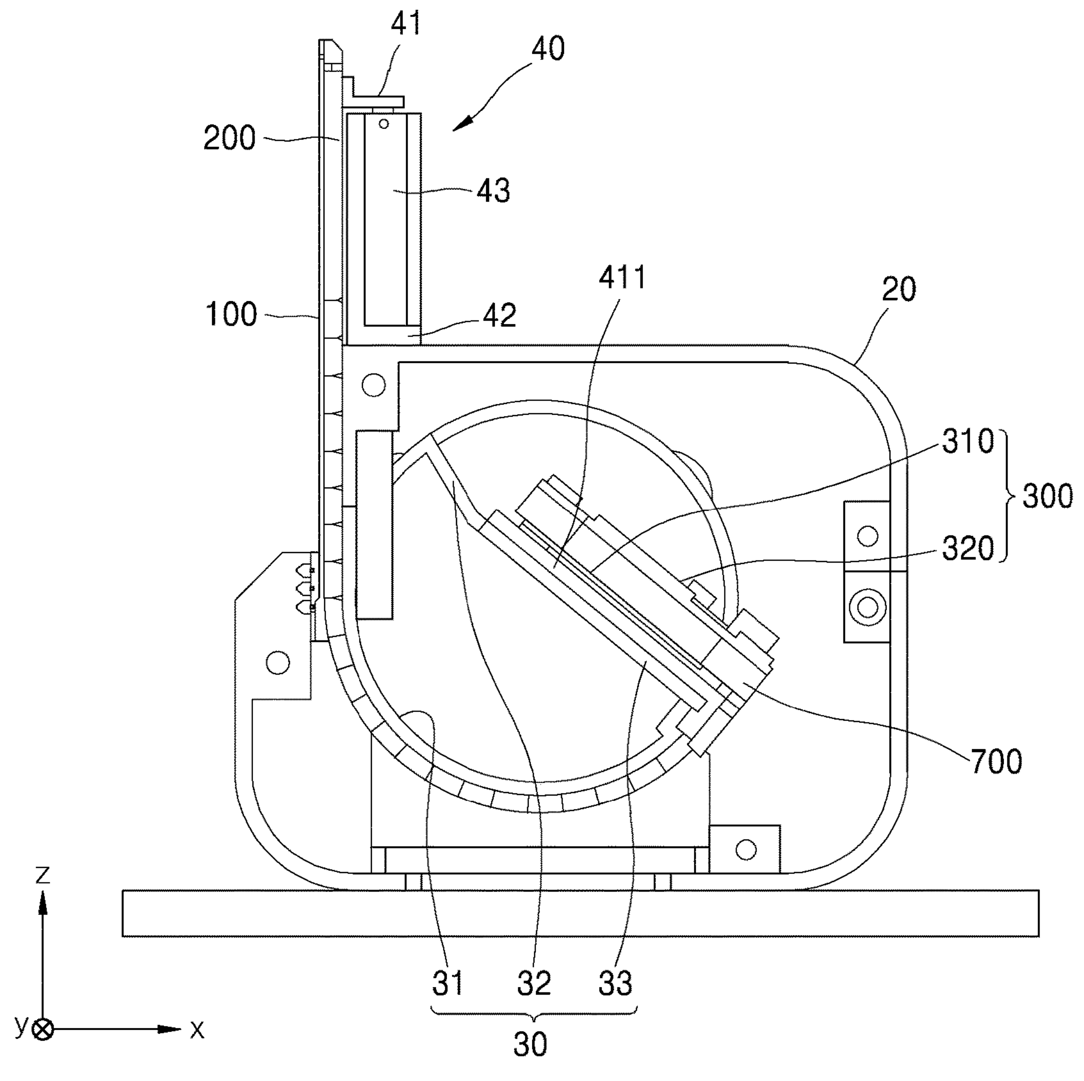

FIG. 10A is a perspective view of a display apparatus according to an embodiment of the present disclosure. FIG. 10B is a side cross-sectional view of the display apparatus according to an embodiment of FIG. 10A. FIG. 10C is a view showing the state in which a portion of each of the display panel 100 and the apron 200 in FIG. 10B is accommodated in the housing 20.

The display apparatus according to embodiment can include the display module 10, the housing 20, a rolling guide 30, a guider 40, and a motor 50. The display module 10 is the same as described above.

The housing 20 can accommodate at least a portion of the display module 10. For example, the housing 20 can be embedded in a dashboard of the vehicle. In this regard, each of the display panel 100 and the apron 200 can be constructed so that at least a portion thereof is exposed out of the dashboard. In one example, a size of an area of the display panel 100 and a size of an area of the apron 200 as accommodated in the housing 20 can be different from each other.

Referring to FIG. 10A and FIG. 10B, when the display panel 100 and the apron 200 move up, the portion thereof which has been accommodated in the housing 20 in the bent state is unfolded again so to be exposed out of the housing 20. Thus, the user views an image or video reproduced on the unfolded portion of the display panel 100.

Referring to FIG. 10C, when the display panel 100 and the apron 200 move downwards, at least a portion of the display panel 100 and at a least portion of the apron 200 are bent and deformed into a curved shape when viewed from a side so to be accommodated in the housing 20.

The rolling guide 30 can be accommodated in the housing 20 and can be constructed to rotate with respect to the housing 20. The rolling guide 30 can be constructed so that the display module 10 is mounted thereon, and at least a portion of each of the display panel 100 and the apron 200 is wound around the rolling guide.

The guider 40 has one end mounted on the apron 200 and the other end mounted on the housing 20. The guider 40 can move the display panel 100 and the apron 200 in the first direction to change the areas of the display panel 100 and the apron 200 as exposed out of the housing.

The guider 40 can include a bracket 700, a movable portion 44, and a reinforcing plate 45. The bracket 700 can include a first bracket 41, a second bracket 42, and a third bracket 43. The first bracket 41 can be coupled to the apron 200 and move together with the apron 200. The first bracket 41 can have a bar shape and can have a length direction parallel to the second direction, and can be coupled to a top of the rear face of the apron 200.

The first bracket 41 is constructed to move up or down along with the display apparatus. As the first bracket 41 moves up or down, the apron 200 and the display panel 100 coupled thereto move up or down, so that an exposed area thereof can vary.

The second bracket 42 can be coupled to the housing 20. The second bracket 42 can have a bar shape, and a length direction parallel to the second direction and can be coupled to the housing 20. The housing 20 can support the second bracket 42.

The third bracket 43 can be formed to protrude upward from the second bracket 42. The third bracket 43 can be embodied as a pair in which the third brackets 43 can be disposed to be spaced apart from each other by a predetermined distance in the second direction. A hollow in which the movable portion 44 is mounted can be formed in the third bracket 43.

The guider 40 can further include the reinforcement plate 45. The reinforcement plate 45 is disposed between the pair of third brackets 43 that are spaced apart from each other, and is coupled thereto. Thus, the reinforcement plate 45 can serve to maintain a designed separation distance between the pair of third brackets 43. The reinforcement plate 45 can be formed in a plate shape and can be manufactured integrally with the pair of third brackets 43. However, the reinforcement plate 45 is not an essential component of the display apparatus.

In one example, the second bracket 42, the third bracket 43 and the reinforcement plate 45 can be integrally manufactured with each other. However, the disclosure is not limited thereto.

The movable portion 44 can be constructed so that one end thereof is coupled to the first bracket 41 and is inserted into the third bracket 43 so as to be movable in the first direction with respect to the third bracket 43. The movable portion 44 can be inserted into the hollow of the third bracket 43 so as to move up and down with respect to the third bracket 43.

Accordingly, as the movable portion 44 moves up and down, the first bracket 41, the apron 200 coupled thereto, and the display panel 100 coupled to the apron 200 move up and down, and accordingly, the exposed area of each of the apron 200 and the display panel 100 can vary.

The movable portion 44 can support the display panel 100 and the apron 200 so that the exposed portions of the display panel 100 and the apron 200 maintain a linear state while the display panel 100 and the apron 200 is ascending and descending.

The motor 50 can be configured to allow the movable portion to move up or down the display panel 100 and the apron 200. Further, the movable portion 44 can be raised and lowered under an operation of the motor 50. The motor 50 can be coupled to the housing 20, and a rotating shaft thereof can be coupled to the rolling guide 30.

When the motor 50 rotates, the rolling guide 30 rotates, and accordingly the display panel 100 and the apron 200 can be wound or unwound around the rolling guide 30.

Referring to FIG. 10B, when the motor 50 rotates in a direction in which the display panel 100 and the apron 200 are unwound from the rolling guide 30, a top of each of the display panel 100 and the apron 200 moves up, thereby increasing the exposed areas thereof. At this time, the movable portion 44 coupled to the apron 200 can move up.

Referring to FIG. 10C, when the motor 50 rotates in a direction in which the display panel 100 and the apron 200 are wound around the rolling guide 30, the top of each of the display panel 100 and the apron 200 descends, thereby reducing the exposed area thereof. At this time, the movable portion 44 coupled to the apron 200 can move down.

Hereinafter, the rolling guide 30 will be described in more detail. The rolling guide 30 can include a curved portion 31, a bridge 32 and a rib 33. The display panel 100 and the apron 200 can be wound around the curved portion 31 on an outer circumferential face thereof. The curved portion 31 can be formed in, for example, a circular arc.

The curved portion 31 can be embodied as a pair, wherein two curved portions can be spaced apart from each other in the second direction of the display panel 100. In this regard, the rib 33 can be disposed between the pair of curved portions 31.

As the motor 50 operates and thus the rolling guide 30 rotates, an area by which each of the display panel 100 and the apron 200 is wound around the curved portion 31 can vary. As shown in FIG. 10B, when the top of each of the display panel 100 and the apron 200 reaches a designed highest vertical level and thus the display panel 100 is fully unfolded, there can be no or very small area by which each of the display panel 100 and the apron 200 is wound around the curved portion 31.

Conversely, as shown in FIG. 10C, when the rolling guide 30 rotates and thus the top of each of the display panel 100 and the apron 200 reaches a designed lowest vertical level, an area by which each of the display panel 100 and the apron 200 is wound around the curved portion 31 can be the maximum.

The bridge 32 can connect both ends of the curved portion 31 to each other. As in the curved portion 31, the bridge 32 can be embodied as a pair. The curved portion 31 and the bridge 32 can be integrally formed with each other. The disclosure is not limited thereto. The bridge 32 can be formed approximately in a plate shape, and both ends of the rib 33 can be respectively coupled to the pair of bridges 32.

The rib 33 can be coupled to the bridge 32. The printed circuit board 300 and the bracket 700 can be mounted on the rib. The rib can be coupled to a bottom portion of the apron 200. The rib 33 can be formed in a generally plate-like shape.

A seat plate 411 of the bracket 700 can be coupled to one face of the rib 33 via a coupling mechanism such as a screw bolt. According to an embodiment, each of first and second substrates 310 and 320 of the printed circuit board 300, and the seat plate 411 of the bracket 700 on which the first and second substrates 310 and 320 of the printed circuit board 300 are mounted can have a length direction parallel to the second direction of the display panel 100.

Accordingly, the rib 33 can be formed to have a length direction parallel to the second direction, for example, the lateral direction of the display panel 100 and thus can have a shape corresponding to a shape of the seat plate 411 of the bracket 700. Due to this structure, the rolling guide 30 can provide a sufficient space in which the first and second substrates 310 and 320 of the printed circuit board 300 are placed.

The bracket 700 on which the first and second substrates 310 and 320 have been mounted can be attached to the rib 33. The first and second substrates 310 and 320 can be coupled to the bracket 700 and, in this state, can be mounted on the rib 33, and thus can rotate together with the rotation of the rolling guide 30.

Figure 11:
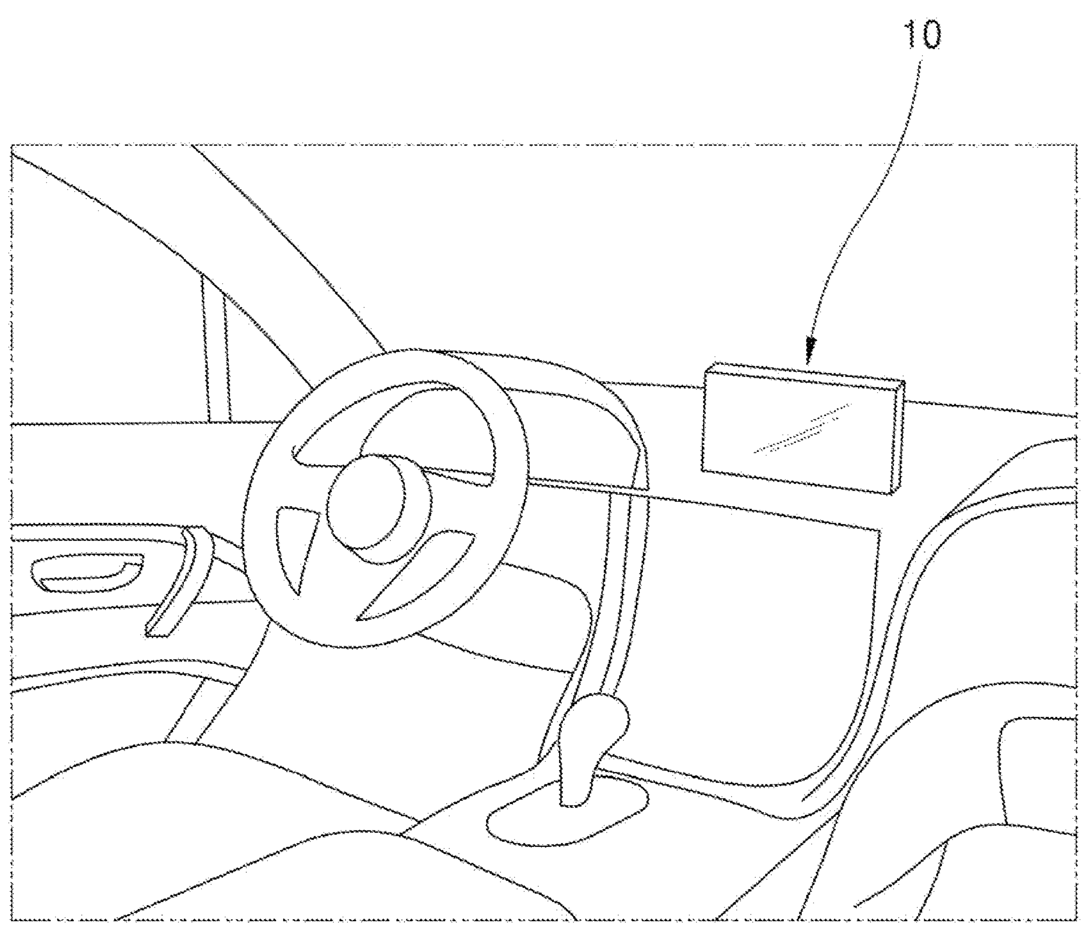
FIG. 11 is a view showing an inside of a vehicle to which a display apparatus according to an embodiment of the present disclosure is applied.

FIG. 11 is a diagram showing a state in which a display apparatus (including the display module 10) to which an embodiment of the present disclosure is applied is placed in a vehicle. A display apparatus can be placed at a top of a center of a center fascia. The display apparatus can be rolled and stored in the housing 20 in a parking mode. The display apparatus can be rolled up to come out of the housing 20 in a starting or driving mode.

A display apparatus according to an embodiment of the present disclosure can be described as follows.

A first aspect of the present disclosure provides a display apparatus comprising: a display panel constructed so that at least a portion thereof is deformable, an apron structure supporting the display panel, and a printed circuit board electrically connected to the display panel, wherein at least a portion of the apron structure is bendable, and the apron structure includes gap-maintaining means (or gap-maintaining unit) disposed at the bendable portion thereof.

In one implementation of the first aspect, the apron structure includes a top apron disposed at a top of the display panel, a link apron disposed at a middle region of the display panel, and a bottom apron disposed at a bottom of the display panel.

In one implementation of the first aspect, the top apron, the link apron, and the bottom apron are connected to each other.

In one implementation of the first aspect, the gap-maintaining means includes a gap-maintaining pin and a gap-maintaining hole, wherein the link apron includes a plurality of gap-maintaining pins and a plurality of gap-maintaining holes.

In one implementation of the first aspect, the display apparatus further comprises a foam-tape, a bottom plate and a back plate, wherein the foam-tape, the bottom plate and the back plate are disposed between the display panel and the apron structure.

In one implementation of the first aspect, the foam-tape is attached to one face of the apron structure.

In one implementation of the first aspect, at least a portion of the link apron has a trapezoidal cross section.

In one implementation of the first aspect, each of the bottom apron and the top apron includes at least one gap-maintaining pin and at least one gap-maintaining hole.

A second aspect of the present disclosure provides a display apparatus including a display panel, a back plate, a bottom plate and an apron for supporting the display panel, and a foam-tape disposed between the bottom plate and the apron structure, wherein at least a portion of the apron structure is bendable, and the apron structure includes gap-maintaining means (or gap-maintaining unit) disposed at the bendable portion thereof.

In one implementation of the second aspect, the apron structure includes a top apron disposed at a top of the display panel, a link apron disposed at a middle region of the display panel, and a bottom apron disposed at a bottom of the display panel.

In one implementation of the second aspect, the top apron, the link apron, and the bottom apron are connected to each other.

In one implementation of the second aspect, the gap-maintaining means includes a gap-maintaining pin and a gap-maintaining hole, wherein the link apron includes a plurality of gap-maintaining pins and a plurality of gap-maintaining holes.

In one implementation of the second aspect, the foam-tape is attached to one face of the apron structure.

In one implementation of the second aspect, at least a portion of the link apron has a trapezoidal cross section.

In one implementation of the second aspect, each of the bottom apron and the top apron includes at least one gap-maintaining pin and at least one gap-maintaining hole.

The features, the structures, the effects, etc. as described in the examples of the present application as described above are included in at least one example of the present disclosure, and are not necessarily limited to only one example. Furthermore, the features, the structures, the effects, etc. illustrated in at least one example of the present disclosure can be combined with each other or modified in other examples by those of ordinary skill in the art to which the present application belongs. Therefore, the combinations and the modifications should be interpreted as being included in the scope of the present disclosure.

The present disclosure as described above is not limited to the above-described embodiments and the accompanying drawings. It will be apparent to those of ordinary skill in the technical field to which the present disclosure belongs that various substitutions, modifications and changes can be made within the scope not departing from the technical ideas of the present disclosure. Therefore, the scope of the present disclosure is indicated by the following claims, and all changes or modifications derived from the meaning and scope of the claims and their equivalent concepts should be construed as being included in the scope of the present disclosure.

What is claimed is:

1. A display apparatus comprising:

a display panel constructed so that at least a portion thereof is deformable;

an apron structure supporting the display panel;

a bottom plate disposed between the display panel and the apron structure;

a foam-tape disposed between the bottom plate and the apron structure; and a printed circuit board electrically connected to the display panel, wherein the apron structure includes at least a bendable portion, wherein the apron structure further includes a gap-maintaining unit disposed at the bendable portion of the apron structure, and wherein the gap-maintaining unit includes a gap-maintaining pin and a gap-maintaining hole.

2. The display apparatus of claim 1, wherein the apron structure includes a top apron disposed at a top region of the display panel, a link apron disposed at a middle region of the display panel, and a bottom apron disposed at a bottom region of the display panel.

3. The display apparatus of claim 2, wherein the top apron, the link apron, and the bottom apron are connected to each other.

4. The display apparatus of claim 3, wherein the link apron includes a plurality of gap-maintaining pins and a plurality of gap-maintaining holes.

5. The display apparatus of claim 1, further comprising a back plate, wherein the back plate are disposed between the display panel and the bottom plate.

6. The display apparatus of claim 5, wherein the foam-tape is attached to one face of the apron structure.

7. The display apparatus of claim 2, wherein at least a portion of the link apron has a trapezoidal cross section.

8. The display apparatus of claim 4, wherein each of the bottom apron and the top apron includes at least one gap-maintaining pin and at least one gap-maintaining hole.

9. The display apparatus of claim 1, wherein a cross section of the apron structure is shaped so that one face thereof adjacent to the display panel is kept flat, and another face thereof has a trapezoidal shape formed by removing a portion thereof.

10. The display apparatus of claim 4, wherein the gap-maintaining hole has a length which is smaller than that of the gap-maintaining pin, and a vertical dimension of the gap-maintaining hole is larger than that of the gap-maintaining pin.

11. The display apparatus of claim 4, wherein the gap-maintaining hole has an inner bent face, and the bent face is bent at an obtuse angle.

12. The display apparatus of claim 11, wherein the gap-maintaining pin includes a gap-maintaining extension and an elliptical gap-maintaining head, and the gap-maintaining head enters the gap-maintaining hole along the bent face of the gap-maintaining hole.

13. The display apparatus of claim 12, wherein a vertical dimension of a bent portion of the gap-maintaining hole is greater than or equal to that of the gap-maintaining head.

14. A display apparatus comprising:

a display panel;

a back plate, a bottom plate, and an apron structure supporting the display panel; and a foam-tape disposed between the bottom plate and the apron structure, wherein at least a portion of the apron structure is bendable, and the apron structure includes a gap-maintaining unit disposed at the bendable portion of the apron structure, and wherein the gap-maintaining unit includes a gap-maintaining pin and a gap-maintaining hole.

15. The display apparatus of claim 14, wherein the apron structure includes a top apron disposed at a top region of the display panel, a link apron disposed at a middle region of the display panel, and a bottom apron disposed at a bottom region of the display panel.

16. The display apparatus of claim 15, wherein the top apron, the link apron, and the bottom apron are connected to each other.

17. The display apparatus of claim 16, wherein the link apron includes a plurality of gap-maintaining pins and a plurality of gap-maintaining holes.

18. The display apparatus of claim 14, wherein the foam-tape is attached to one face of the apron structure.

19. The display apparatus of claim 15, wherein at least a portion of the link apron has a trapezoidal cross section.

20. The display apparatus of claim 17, wherein each of the bottom apron and the top apron includes at least one gap-maintaining pin and at least one gap-maintaining hole.

21. The display apparatus of claim 15, wherein the foam-tape is disposed on a top of the link apron.

22. The display apparatus of claim 14, wherein a cross section of the apron structure is shaped so that one face thereof adjacent to the display panel is kept flat, and another face thereof has a trapezoidal shape formed by removing a portion thereof.

23. The display apparatus of claim 17, wherein the gap-maintaining hole has a length which is smaller than that of the gap-maintaining pin, and a vertical dimension of the gap-maintaining hole is larger than that of the gap-maintaining pin.

24. The display apparatus of claim 1, wherein the apron structure includes a link apron, wherein the link apron includes a plurality of interconnected apron links with each apron link including a plurality of gap-maintaining units, each gap-maintaining unit including a gap-maintaining pin and a gap-maintaining hole, and wherein the foam-tape is attached to an upper surface of each apron link.

25. The display apparatus of claim 1, wherein the display panel includes a substrate, a transistor disposed on the substrate, and a light emitting element disposed on the transistor, and the bottom plate is disposed between a bottom surface of the substrate of the display panel and a top surface of the apron structure.

* * * * *